United States Patent [19]

Ikeda et al.

[11] Patent Number: 4,841,481
[45] Date of Patent: Jun. 20, 1989

[54] SEMICONDUCTOR MEMORY DEVICE

[75] Inventors: Shuji Ikeda, Koganei; Satoshi Meguro, Hinode; Kotaro Nishimura; Sho Yamamoto, both of Kodaira; Nobuyoshi Tanimura, Musashino, all of Japan

[73] Assignee: Hitachi, Ltd., Tokyo, Japan

[21] Appl. No.: 225,467

[22] Filed: Jul. 28, 1988

Related U.S. Application Data

[62] Division of Ser. No. 899,404, Aug. 22, 1986, Pat. No. 4,774,203.

[51] Int. Cl.[4] .................... G11C 11/00; G11C 7/00; H03K 3/284; H01L 29/78
[52] U.S. Cl. ................................. 365/154; 365/156; 365/190; 307/272.1; 357/23.5; 357/41
[58] Field of Search ............... 365/154, 156, 177, 190; 437/52, 60; 307/272 R

[56] References Cited

U.S. PATENT DOCUMENTS 4,748,487 5/1988 Uchida et al. .................. 365/190

Primary Examiner—Terrell W. Fears
Assistant Examiner—Melissa J. Koval
Attorney, Agent, or Firm—Antonelli, Terry & Wands

[57] ABSTRACT

An SRAM including a memory cell having a high-resistance load element. The load element is formed from a polysilicon film, and an impurity is introduced into a least a part of the polysilicon film for the purpose of increasing the threshold voltage of a parasitic MISFET formed using the load element as its channel region. Alternatively, the deposition of the polysilicon film is carried out at a relatively high temperature, thereby preventing any increase in the current flowing through the load element, and thus reducing the power dissipation in the SRAM.

6 Claims, 12 Drawing Sheets

SEMICONDUCTOR MEMORY DEVICE

This is a divisional of application Ser. No. 899,404, filed 8/22/86, now U.S. Pat. No. 4,477,203.

BACKGROUND OF THE INVENTION

The present invention relates to a semiconductor memory device and, more particularly, to a technique which may be effectively applied to a semiconductor integrated circuit device having a static random-access memory (hereinafter referred to as an "SRAM").

Each of the memory cells in an SRAM generally comprises a flip-flop and two transfer MISFET's. The flip-flop is composed of a pair of inverter circuits each comprising of a high-resistance load element and a drive MISFET, the input and output terminals of these inverter circuits being cross-coupled, and the transfer MISFET's are respectively connected a pair of input and output terminals of the flip-flop. The above-described high-resistance load element is constituted by a polysilicon film which is formed integral with wiring for the power supply voltage for the purpose of reducing the memory cell area.

The polysilicon film used as the high-resistance load element has no n-type impurity (i.e., As or P) introduced therein so that the film has a relatively high resistance. On the other hand, the polysilicon film used as the power supply voltage wiring has the above-described n-type impurity introduced therein. Such technique is disclosed in U.S. Pat. No. 4,554,729 (Japanese Patent Laid-Open No. 130461/1982).

SUMMARY OF THE INVENTION

For the purpose of reducing the area of a memory cell, a data line is formed such as to extend above the high-resistance load element through an insulator film. In such memory cell structure, a parasitic MISFET which has a channel region defined by the high-resistance load element is formed This parasitic MISFET is constituted by a data line which serves as the gate electrode, and n-type polysilicon and single crystal silicon films which respectively serve as source and drain regions, those films being respectively connected to both end portions of the load element. The present inventors examined the parasitic MISFET and have found that a channel is formed in the high-resistance load element by the field effect produced by the operation of the data line, and this leads to an increase in the current flowing through the load element, resulting disadvantageously in an increase in the power dissipation.

In view of the above-described circumstances, it is a primary object of the present invention to provide a technique which may be effectively applied to an SRAM including of memory cells each having a high-resistance load element, the technique enabling prevention of increase in the current flowing through the above-described high-resistance load element, thereby reducing the power dissipation in the SRAM.

The above and other objects, novel features and advantages of the present invention will become clear from the following description of the preferred embodiments thereof, taken in conjunction with the accompanying drawings.

A representative of the novel techniques disclosed in this application will be briefly summarized below.

In an SRAM including of memory cells each having a high-resistance load element, the load element is formed from a polysilicon film. An impurity which increases the threshold voltage of a parasitic MISFET having a channel region defined by the load element is introduced into at least a part of the polysilicon film. Alternatively, the deposition of the polysilicon film is carried out at a relatively high temperature. Thus, it is possible to prevent increase in the current flowing through the high-resistance load element and thereby to reduce the power dissipation in the SRAM.

DESCRIPTION OF THE PREFERRED EMBODIMENTS

Figure 1:
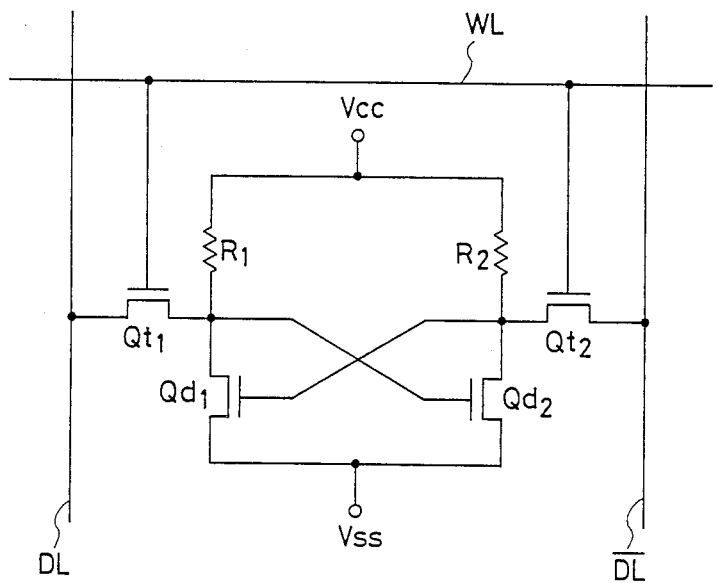
FIG. 1 is a circuit diagram of a memory cell in an SRAM, which is employed to describe the present invention.

Each of the memory cells which constitute an SRAM is provided at an intersection between a pair of complementary data lines DL, $\overline{DL}$ and a word line WL, as shown in FIG. 1.

The memory cell comprises a flip-flop and transfer MISFET's $Qt_1$, $Qt_2$ which are respectively connected between a pair of input and output terminals of the flip-flop and the data lines DL, $\overline{DL}$. The word line WL is connected to the respective gates of the MISFET's $Qt_1$ and $Qt_2$. The flip-flop is composed of two inverter circuits, one of them comprising a high-resistance load element $R_1$ and a drive MISFET $Qd_1$, and the other comprising a high-resistance load element $R_2$ and a drive MISFET $Qd_2$. The input and output terminals of one inverter circuit are respectively coupled to the output and input terminals of the other inverter circuit. Each high-resistance load element R is connected at one end to a power supply voltage $V_{CC}$ and at the other end to the drain region of the corresponding drive MISFET Qd. The source region of each drive MISFET Qd is connected to a reference voltage $V_{SS}$.

The power supply voltage $V_{CC}$ is, for example, the operating voltage, i.e., 5 V, and the reference voltage $V_{SS}$ is, for example, the ground potential, i.e., 0 V, of the circuit.

Figure 2:
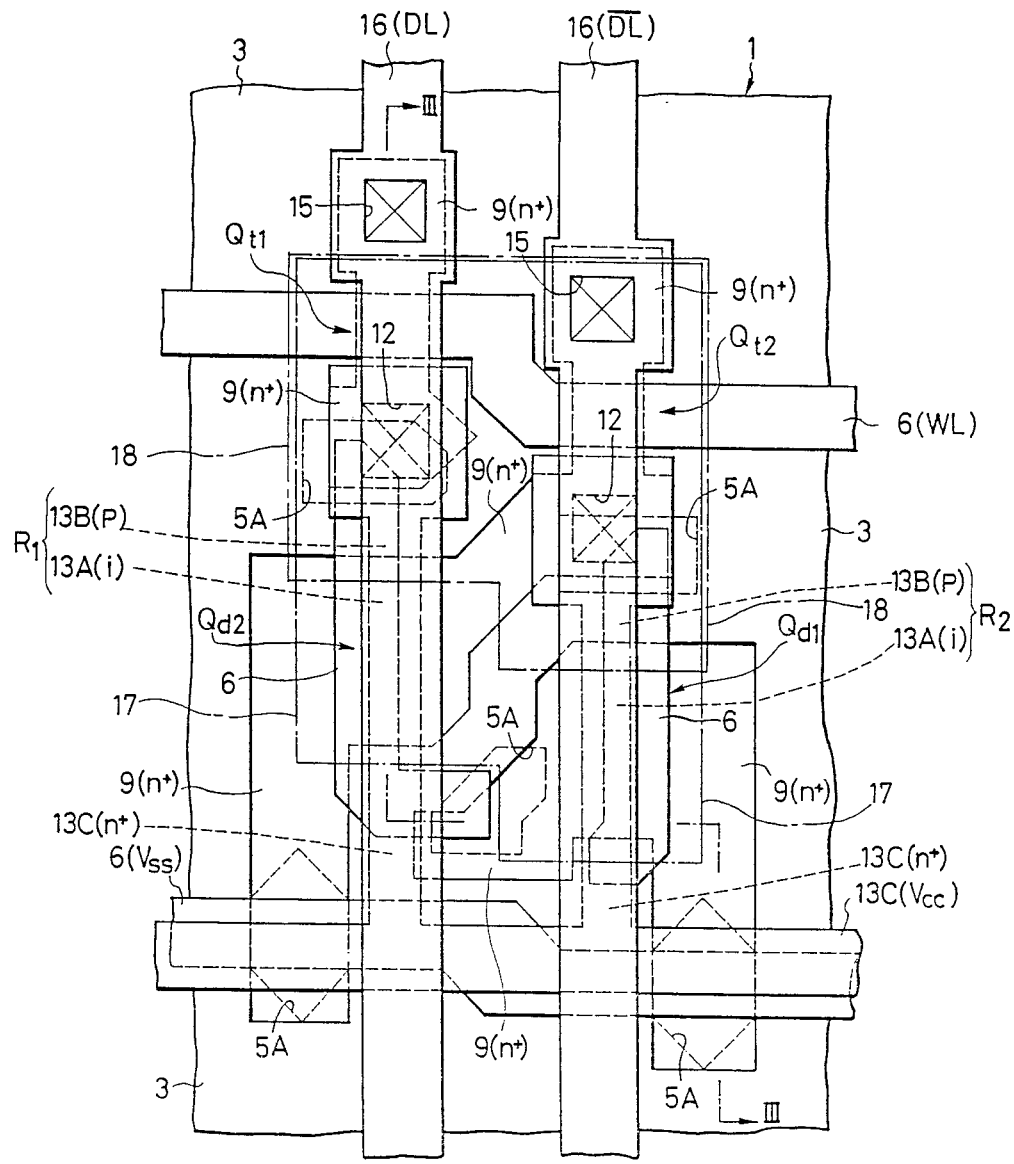
FIG. 2 is a plan view of a memory cell in an SRAM in accordance with a first embodiment of the present invention.
Figure 3:
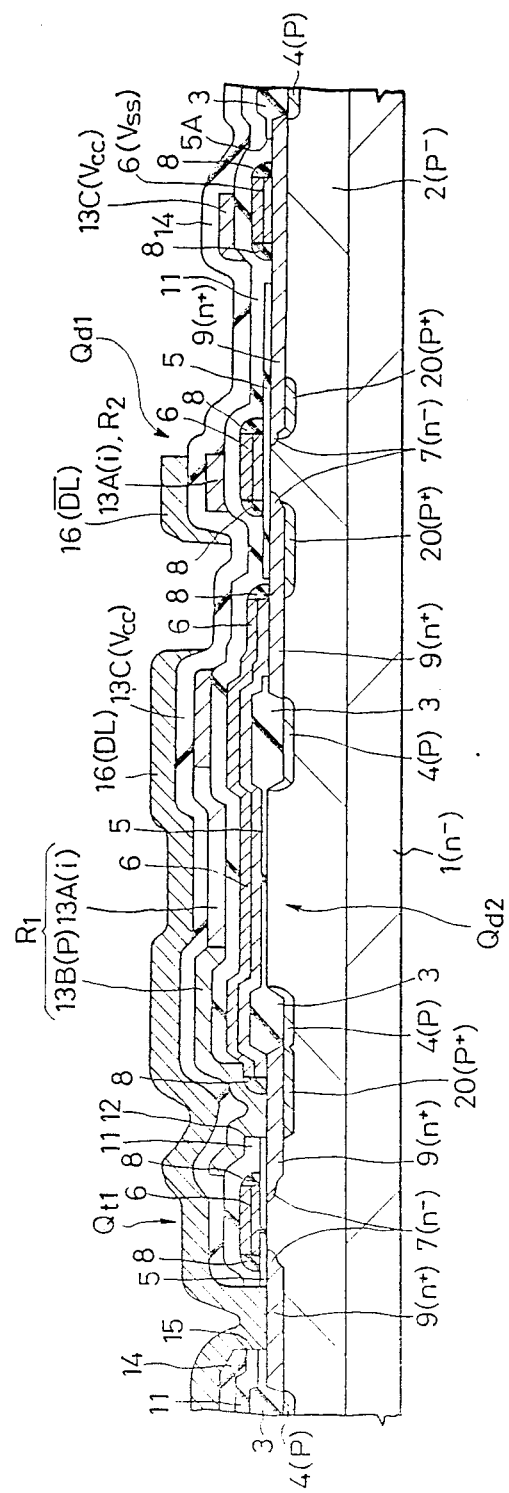
FIG. 3 is a sectional view taken along the line III—III in FIG. 2, which shows a memory cell in an SRAM in accordance with the first embodiment of the present invention.
Figure 4:
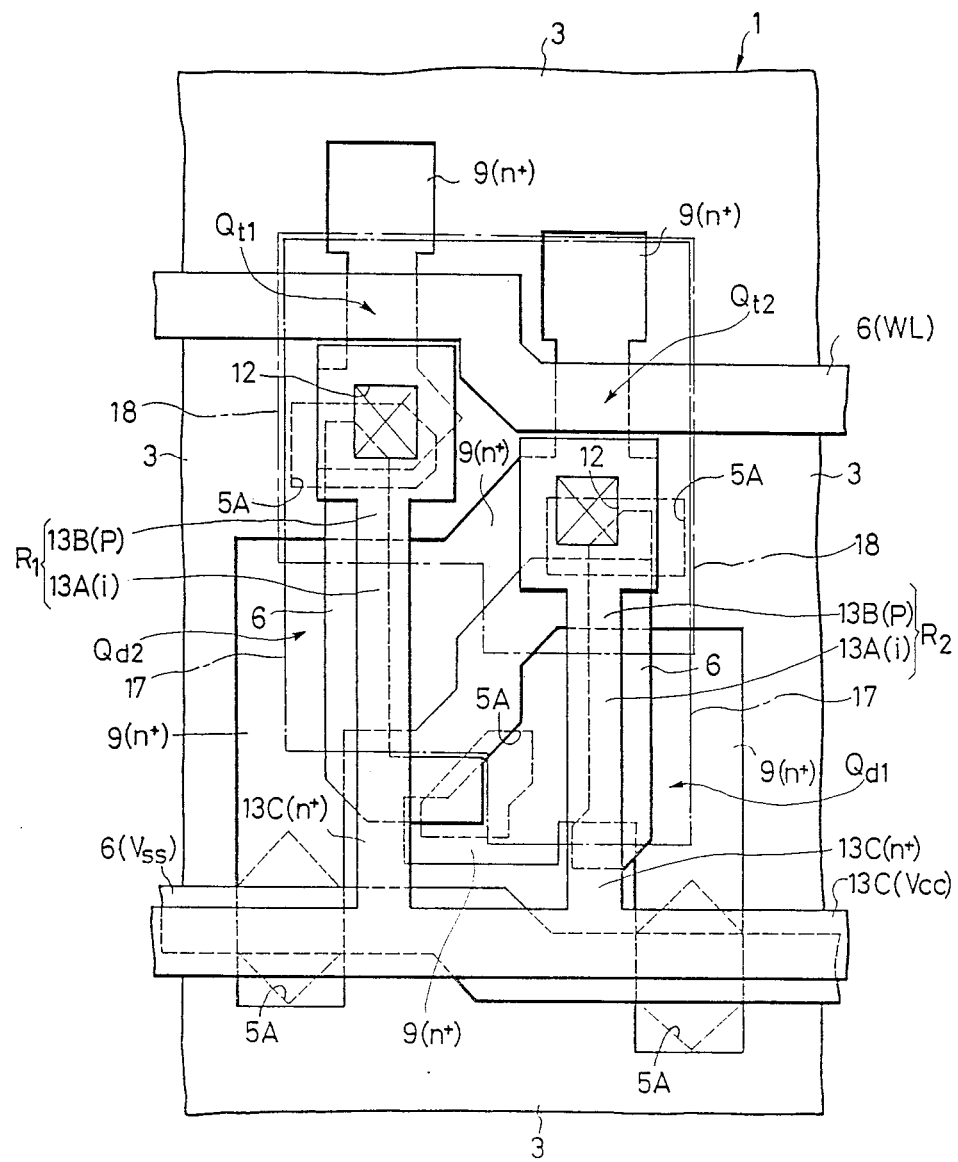
FIGS. 4 to 6 are plan views of a part of the SRAM cell shown in FIG. 2.
Figure 5:
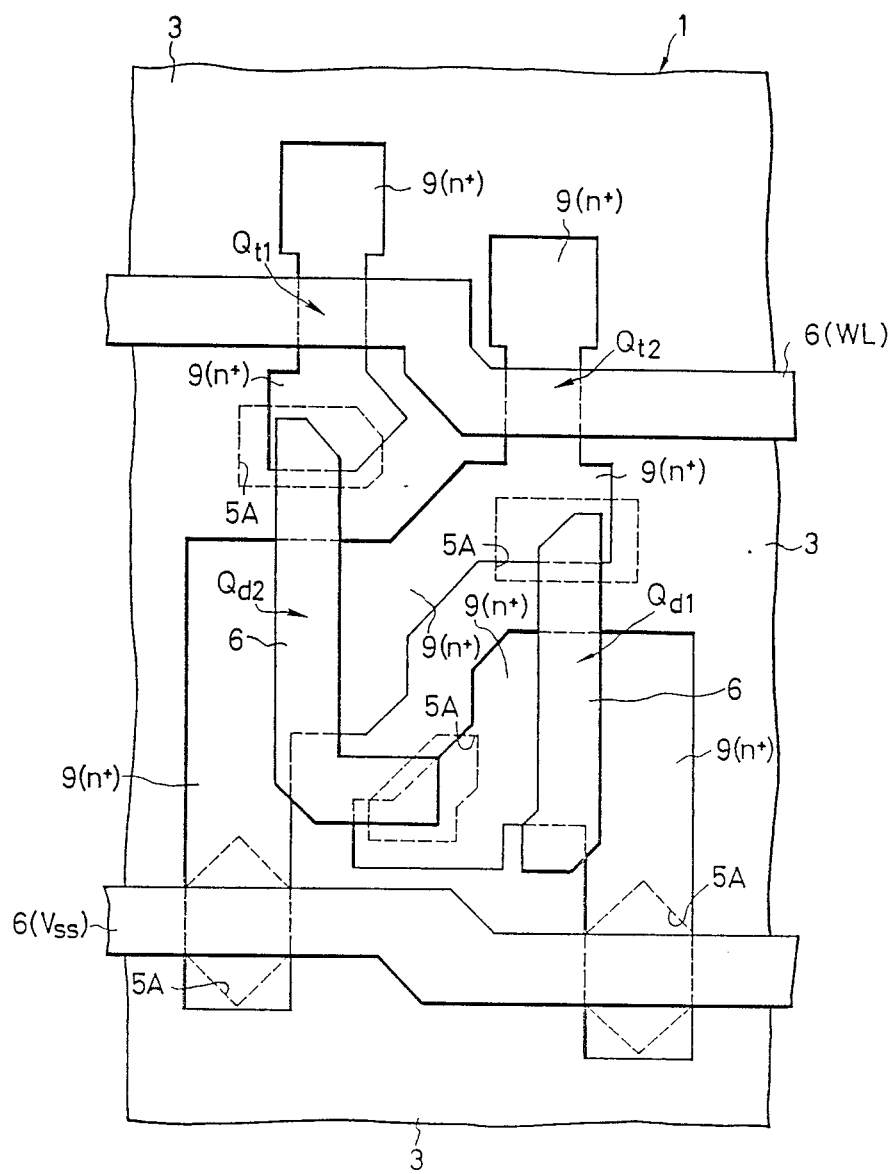
Figure 6:
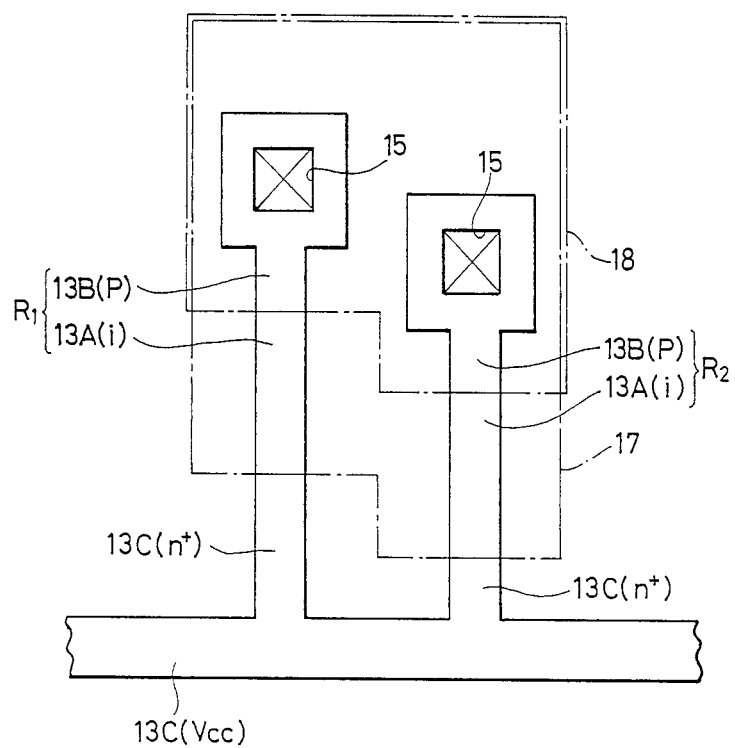

A plan view of an SRAM cell according to the present invention is shown in FIG. 2, and a cross-section of the cell through line III—III in FIG. 2 is shown in FIG. 3. In addition, FIGS. 4 to 6 show in combination the patterns of conductor layers which constitute the memory cell and a field insulator film, for the purpose of facilitating understanding of the present invention. FIG. 4 is a plan view of the memory cell, in which the data lines DL and DL in the arrangement shown in FIG. 2 are omitted. FIG. 5 is a plan view of the memory cell, in which the second-level polysilicon layer and two mask patterns for impurity introduction in the arrangement shown in FIG. 4 are omitted, the second-level polysilicon layer and the mask patterns being shown in FIG. 6. It should be noted that any insulator film provided between each pair of adjacent conductor layers other than the field insulator film is not shown in FIGS. 2, 4 and 5 for the purpose of facilitating the understanding of the arrangement of this embodiment.

In FIGS. 2 to 5, the reference numeral 1 denotes an $n^-$-type semiconductor substrate made of single crystal silicon, and the numeral 2 denotes a $p^-$-type well region. The memory cell is formed within the well region 2. Circuits other than the memory cell are complementary MISFET circuits. The N-channel MISFET is formed within $p^-$-type well region which is different from the $p^-$-type well region 2 in which is provided the memory cell, while the P-channel MISFET is formed in either the $n^-$-type semiconductor substrate 1 or an $n^-$-type well region having an impurity concentration which is different from that of the substrate 1. The reference numeral 3 denotes a field insulator film, and the numeral 4 denotes a p-type channel stopper region. Both the field insulator film 3 and the channel stopper region 4 are formed on the main surface of the semiconductor substrate 1 so as to isolate semiconductor elements such as MISFET's from each other. The configuration of the field insulator film 3 in the memory cell will be clearly understood with reference to FIG. 5.

The MISFET's $Qd_1$, $Qd_2$, $Qt_1$ and $Qt_2$ which constitute the memory cell are formed within the well region 2 and each constituted by a gate insulator film 5, a gate electrode 6A, and a pair of $n^-$- and $n^+$-type semiconductor regions 7 and 9 which respectively serve as source and drain regions, or vice versa.

The gate electrode 6A is constituted by a composite film (i.e., a polycide film) constructed of a polysilicon (polycrystalline silicon) film and a silicide film of a refractory metal (Mo, Ta, Ti or W) provided thereon. The polysilicon film has an impurity (As or P) introduced therein for the purpose of reducing the resistance value thereof. The gate electrode 6A may be constituted by any one of the following films, that is, a single layer of a refractory metal film or a refractory metal silicide film, or a composite film consisting of a polysilicon film and a refractory metal film provided thereon. The respective gate electrodes 6A of the MISFET's $Qt_1$ and $Qt_2$ are formed integral with each other and extended in the horizontal direction as viewed in the drawings to form a word line WL. The respective gate electrodes 6A of the MISFET's $Qd_1$ and $Qd_2$ are directly connected to the semiconductor regions 9 (and 7) of the other MISFET's through contact holes 5A formed in the gate insulator film 5. Thus, the cross-coupling of the flip-flop in the memory cell is realized. A reference voltage wiring 6B is formed in the same layer as the gate electrode 6A and made of the same conductive material as that of the gate electrode 6A, the wiring 6B extending parallel to the word line WL. The reference voltage wiring 6B is directly connected to the semiconductor regions 9 which constitute the respective sources of the MISFET's $Qd_1$ and $Qd_2$ through contact holes 5A provided in the gate insulator film 5.

Each semiconductor region 7 is provided between the channel region and the semiconductor region 9 of each of the MISFET's Qt and Qd so as to constitute a part of either the source or drain region thereof. The semiconductor regions 7 are formed by ion implantation using the gate electrodes 6A as a mask, the regions 7 being self-aligned with respect to the gate electrodes 6A. The semiconductor regions 9 are formed by ion implantation using as a mask the gate electrodes 6A and insulator films (side wall spacers) 8 formed on the side walls of the gate electrodes 6A, the regions 9 being self-aligned with respect to these portions. The insulator film 8 is made of, for example, a silicon oxide film, which can be formed using reactive ion etching. The semiconductor regions 7 and 9 constitute in combination a MISFET of the LDD (Lightly Doped Drain). A $p^+$-semiconductor region 20 is formed underneath each of the regions 7 and 9 which are storage nodes of the memory cells, thereby increasing the junction capacitance, and thus preventing the occurrence of any soft error which might otherwise be caused by α rays.

FIG. 5 clearly shows the respective patterns of the contact holes 5A, the first-level conductor layers 6A, 6B and the semiconductor regions 9 of the memory cell, that is, the respective configurations and connections of the MISFET's $Qd_1$, $Qd_2$, $Qt_1$ and $Qt_2$. The insulator films 8 and the semiconductor regions 7 are not shown in FIG. 5 (and FIGS. 2 and 4).

The reference numeral 10 denotes an insulator film which is made of, for example, a silicon oxide film, the insulator film 10 being provided above each of the semiconductor region 9 and above the electrodes or wirings 6A, 6B. The reference numeral 11 denotes an insulator film which is made of, for example, a phosphosilicate glass (PSG) film, and which is provided over the whole surface of the semiconductor substrate 1 in such a manner as to cover the MISFET's Qt and Qd. Contact holes 12 are provided by removing the insulator films 10 and 11 above predetermined semiconductor regions 9.

On the insulator film 11 are formed high-resistance load elements $R_1$ and $R_2$ and a power supply voltage wiring, which are composed of the same level layer made of the same material as each other. More specifically, they are formed from a polysilicon layer which is a second-level conductor layer 13 of the memory cell. One end of the load element $R_1$ is connected to the semiconductor region 9 of the MISFET $Qt_1$ and the gate electrode 6A of the MISFET $Qd_2$ through the corresponding contact hole 12, while one end of the load element $R_2$ is connected to the semiconductor region 9 of the MISFET $Qt_2$ and the gate electrode 6A of the MISFET $Qd_1$, and the other ends of the load elements $R_1$ and $R_2$ are connected to the power supply voltage wiring which is formed integral with the load elements $R_1$ and $R_2$.

As shown in FIGS. 2 to 6, each of the high-resistance load elements $R_1$ and $R_2$ comprises a polysilicon film 13A which has no impurity introduced therein for the purpose of reducing the resistance value thereof, that is, an intrinsic (i) polysilicon film 13A, and a (p) polysilicon film 13B which has a p-type impurity introduced therein. The polysilicon film 13A is provided on the power supply voltage wiring 13C side of each load element R, and the polysilicon film 13B is provided on that side of the load element R which is connected to the semiconductor region 9 of the corresponding transfer MISFET Qt. The power supply voltage wiring 13C is formed by an $n^+$-type polysilicon silicon layer which has an n-type impurity, e.g., arsenic or phosphorus, heavily doped therein for the purpose of minimizing the resistance value thereof.

The polysilicon film 13A is formed within a region surrounded by the dotted line denoted by the reference numeral 17 in FIGS. 2, 4 and 6. The polysilicon film 13B is formed within a region surrounded by the dotted line denoted by the reference numeral 18 in FIGS. 2, 4 and 6. In other words, the load elements $R_1$ and $R_2$ are formed in such a manner that the p-type polysilicon film 13B is provided in a part of the i-type polysilicon film 13A (i.e., the i-p structure).

Introduction of an impurity for forming the region 13B of the polysilicon film 13 is carried out in a state wherein the region other than the region surrounded by the dotted line 18 is covered with a mask. The polysilicon film 13B is formed by, for example, introducing a p-type impurity, e.g., boron fluoride ($BF_2$), into the polysilicon film 13 at 60 KeV and $2 \times 10^{12}$ atoms/cm$^2$ using the ion implantation technique. Thereafter, introduction of an impurity for forming the region 13C in the polysilicon film 13 is carried out in a state wherein the region surrounded by the dotted line 17 is covered with a mask.

The power supply voltage wiring 13C is formed by, for example, introducing an n-type impurity, e.g., arsenic (As) into the polysilicon film 13 at 50 KeV and $5 \times 10^{15}$ atoms/cm$^2$ using the ion implantation technique. Phosphorus (P) may also be employed as an n-type impurity. As he two masks 17 and 18, for example, a resist mask may be employed.

The configuration of the polysilicon film 13 and the discrimination between the regions 13A, 13B and 13C will be clearly understood from FIG. 6.

The reference numeral 14 denotes an insulator film which is made of a silicon oxide film formed over the whole surface of the semiconductor substrate 1 in such a manner as to cover the load elements $R_1$ and $R_2$. The numeral 15 denotes contact holes which are provided by removing the insulator films 10, 11 and 14 above the semiconductor region 9 of each MISFET Qt. The numeral 16 denotes data lines DL and $\overline{DL}$ which are respectively connected to the semiconductor regions 9 of the MISFET's Qt through the contact holes 15, the data lines 16 extending over the insulator film 14. The data lines 16 are formed from an aluminum film or an aluminum film containing predetermined additives (Si and/or Cu).

Figure 7:
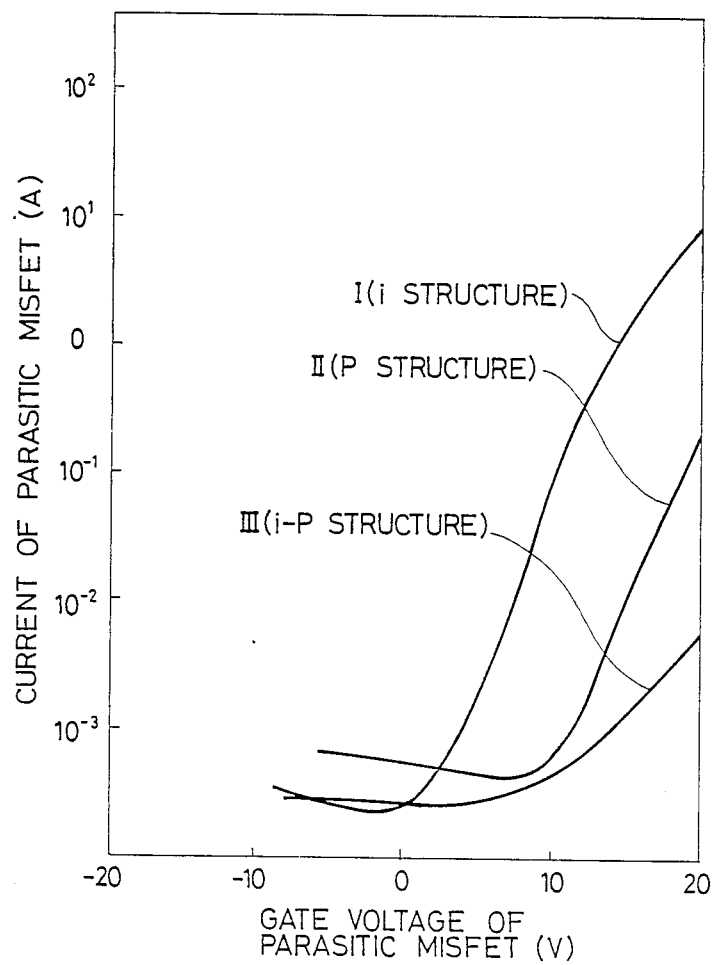
FIG. 7 is a graph showing the relationship between the current flowing through the high-resistance load element and the voltage applied to the data line, which is employed to describe the present invention.

The arrangement wherein at least a part of each of the load elements $R_1$ and $R_2$ is constituted by the polysilicon film 13B having a p-type impurity introduced therein enables an increase in the threshold voltage of a parasitic MISFET which is formed using the load element $R_1$ or $R_2$ as its channel region, as shown in FIG. 7. The parasitic MISFET may be regarded as formed using the insulator film 14 as the gate insulator film, the data line 16 as the gate electrode, the power supply voltage wiring 13C as the drain region, and the semiconductor region 9 of the MISFET Qt as the source region. The threshold voltage of the prasitic MISFET can be set such as to be higher than the voltage (e.g., 0 to 5 V) applied to the data line 16 which serves as the gate electrode of the parasitic MISFET. Accordingly, it is possible to prevent any increase in the current flowing through the load elements $R_1$ and $R_2$ due to the field effect, so that the power dissipation in the SRAM can be reduced.

FIG. 7 is a graph showing the relationship between the current flowing through each of the load element $R_1$ and $R_2$ and the voltage applied to the corresponding data lines 16. The abscissas axis represents the gate voltage of the parasitic MISFET, that is, the voltage applied to the data line 16, and the coordinates axis represents the current flowing through the parasitic MISFET, that is, the current (A) flowing through the load element $R_1$ ($R_2$). The curve I shows data measured when the whole area of the load element $R_1$ ($R_2$) is constituted by an i-type polysilicon film 13A which has no impurity introduced therein. The curve II shows data measured when the whole area of the load element $R_1$ ($R_2$) is constituted by the p-type polysilicon film 13B having a p-type impurity introduced therein. The curve III shows data measured with respect to the SRAM according to the present invention in which the load element $R_1$ ($R_2$) is constituted by the i- and p-type polysilicon films 13A and 13B.

As will be clear from FIG. 7, by forming at least a part of the load element $R_1$ ($R_2$) from the p-type polysilicon film 13B, it is possible to set the threshold voltage of the parasitic MISFET so as to be higher than the voltage applied to the data line 16, as described above.

In addition, it is possible to increase the breakdown voltage at the junction ($n^+$-i junction) between the power supply voltage wiring 13C and the polysilicon film 13A, together with said threshold voltage, by arranging the load element $R_1$ ($R_2$) such that the i-type polysilicon film 13A is provided on that side of the load element which is connected to the $n^+$-type power supply voltage wiring 13C and the p-type polysilicon film 13B is provided on that side of the load element which is connected to the semiconductor region 9. The whole area of the load element $R^1$ ($R_2$) may be constituted by the p-type polysilicon film 13B. However, it is preferable to arrange the load element $R_1$ ($R_2$) in such a manner that the i-type polysilicon film 13A is provided on that side of the load element which dominates the breakdown voltage, and the p-type polysilicon film 13B on that side of the load element which dominates the threshold voltage. In other words, it is possible to optimize the concentration of a p-type impurity which is introduced into the polysilicon film 13B without taking the breakdown voltage into consideration.

According to a second embodiment of the present invention, the threshold voltage of the parasitic MISFET whose channel region is defined by a high-resistance load element which constitutes a part of an SRAM cell is increased by optimizing the conditions in which the load element is formed.

Figure 8:
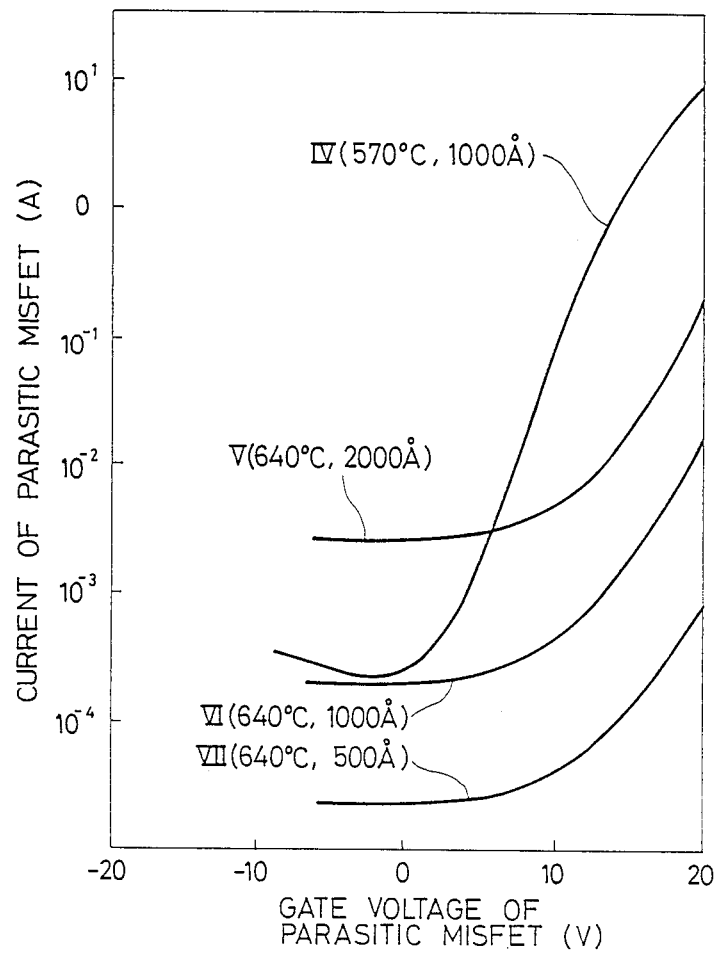
FIG. 8 is a graph showing the relationship between the current flowing through the high-resistance load element and the voltage applied to the data line, which is employed to describe a second embodiment of the present invention.

FIG. 8 shows the relationship between the current flowing through the load element and the voltage applied to the data line for explaining the second embodiment.

The curve IV shows data measured when the load elements $R_1$ and $R_2$ are constituted by an i-type polysilicon film 13A which is deposited by the CVD technique at a temperature of 570° C. and which has no impurity introduced therein for the purpose of lowering the resistance value thereof. This polysilicon 25 film 13A has a thickness of about 1000 Å. The polysilicon film 13A, which is deposited at the above-described temperature, is amorphous.

The curve V, VI and VII shows data measured when the load elements $R_1$ and $R_2$ are constituted by an i-type polysilicon film 13A which is deposited by the CVD technique at a relatively high temperature, about 640° C., and which has no impurity introduced therein for the purpose of lowering the resistance value thereof. The polysilicon film 13A shown by the curve V has a thickness of about 2000 Å, while the polysilicon film 13A shown by the curve VI has a thickness of about 1000 Å, and the polysilicon film 13A shown by the curve VII has a thickness of about 500 Å. The polysilicon film 13A, which is deposited at the above-described temperature, is polycrystalline.

As will be clear from the curves VI and VII in FIG. 8, when the load elements $R_1$ and $R_2$ are constituted by a polysilicon film 13A which is formed at a relatively high temperature, about 640° C. and with a thickness of about 1000 Å or less, the threshold voltage of the load elements $R_1$ and $R_2$ can be made higher than that of those which are constituted by a polysilicon film 13A formed at a temperature of about 570° C. This threshold voltage is higher than the voltage (e.g., 5 V) which is applied to the data lines 16. Accordingly, it is possible to prevent any increase in the current flowing through the parasitic MISFET's whose channel regions are respectively defined by the load elements $R_1$ and $R_2$, and this enables a reduction in the power dissipation in the SRAM.

The load elements $R_1$ and $R_2$ are formed at a temperature of about 600° C. or higher. The orientation and deposition state of the silicon crystal change at about 570° to 600° C. Accordingly, the load elements $R_1$ and $R_2$ are formed at a relatively high temperature i.e., 600° C. or higher, in order to make the polysilicon film 13A polycrystalline and increase the threshold voltage. It is preferable to form the load elements $R_1$ and $R_2$ at a temperature of about 700° C. or lower. This is because a temperature higher than 700° C. increases the deposition rate of the polysilicon film 13A, and this leads to various problems such as nonuniformity in the film thickness.

It should be noted that, when the polysilicon film is positively utilized as the channel region of a MISFET in place of the parasitic MISFET, the polysilicon film is formed at a temperature of 570° C. or lower. This is because such relatively low temperature enables lowering in the state of the polysilicon film and it is therefore possible to lower the threshold voltage and thereby obtain excellent MIS characteristics.

According to the second embodiment, it is possible to increase the threshold voltage of the parasitic MISFET's whose channel regions are respectively defined by the load elements $R_1$ and $R_2$.

The above-described SRAM is basically mentioned in U.S. patent application Ser. No. 764,208 filed on Aug. 8, 1985 cited in this specification as a reference in place of the description in this specification.

According to the first embodiment, the arrangement of the load elements $R_1$ and $R_2$ is changed as described above in accordance with the present invention. In consequence, the method of forming the load elements $R_1$ and $R_2$ is changed. More specifically, the polysilicon film 13 is formed over the whole surface of the semiconductor substrate 1 by CVD and patterned in the shape shown in FIG. 6, and the first resist mask 18 is then formed. After the ion implantation of a p-type impurity using the mask 18, the mask 18 is removed, and the second resist mask 17 is newly formed. Then, ion implantation of an n-type impurity is carried out using the mask 17.

According to the second embodiment, CVD for forming the polysilicon film 13 employed to constitute the load elements $R_1$ and $R_2$ is carried out at the above-described temperature, and the thickness of the film 13 is also limited.

By virtue of the novel technique disclosed in this application, the following advantages are obtained.

(1) A high-resistance load element which constitutes a part of an SRAM cell is formed from a polysilicon film, and an impurity of a predetermined conductivity type is introduced into a part of the polysilicon film, whereby it is possible to increase the threshold voltage of a parasitic MISFET which is formed using the load element as its channel region.

(2) The load element is formed from a polysilicon film which is formed at a relatively high temperature, about 600° C. or higher, and with a thickness of about 1000 Å or less, whereby it is possible to increase the threshold voltage of a prasitic MISFET formed using the load element as its channel region.

(3) Since it is possible to prevent any increase in the current flowing through the load element by virtue of the advantages (1 and 2, the power dissipation in the SRAM can be reduced.

Although the invention accomplished by the present inventors has be described above in detail by way of the embodiments, it is a matter of course that the present invention is not necessarily limitative to the above-described embodiments and various changes and modifications may be imparted thereto without departing from the gist of the invention.

Figure 9:
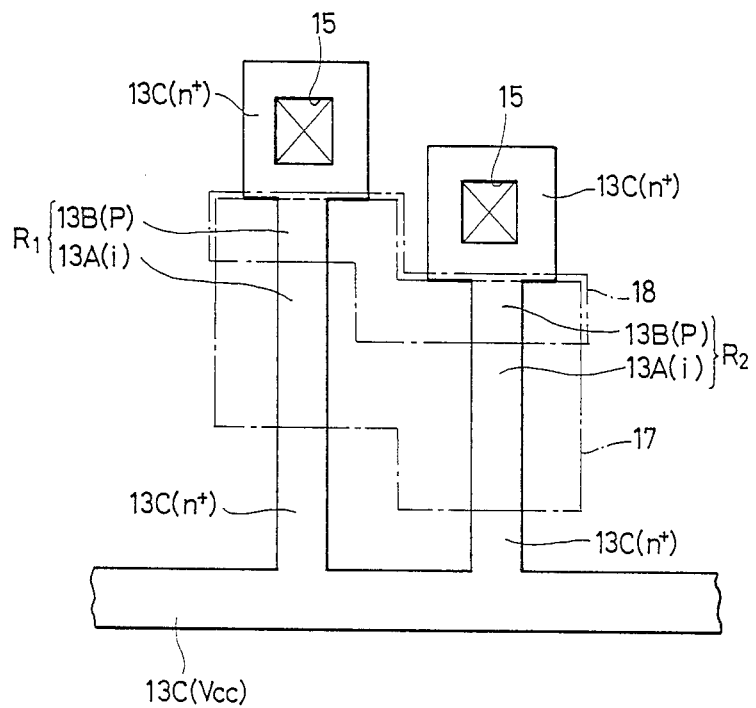
FIGS. 9 and 10 are a plan and a sectional view, respectively, of an essential part of a memory cell, which are employed to describe a further embodiment of the present.

The position at which the p-type impurity-doped region 13B is formed may be variously changed. Examples thereof are shown in FIGS. 9 to 12. FIGS. 9 and 11 correspond to FIG. 6, and FIGS. 10 and 12 correspond to FIG. 3.

Figure 10:
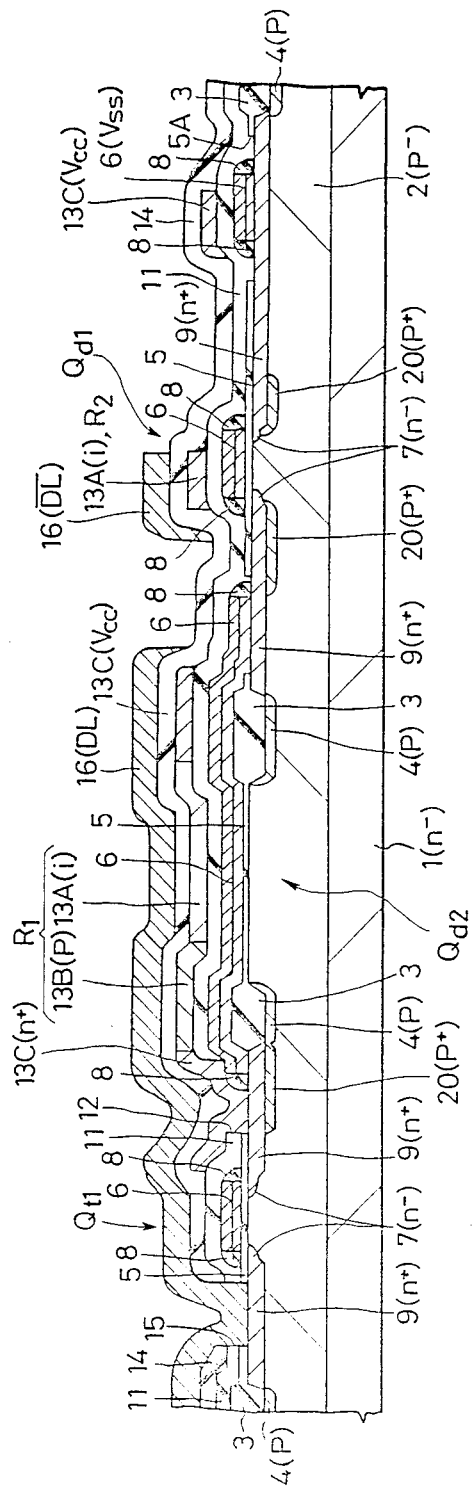
Figure 11:
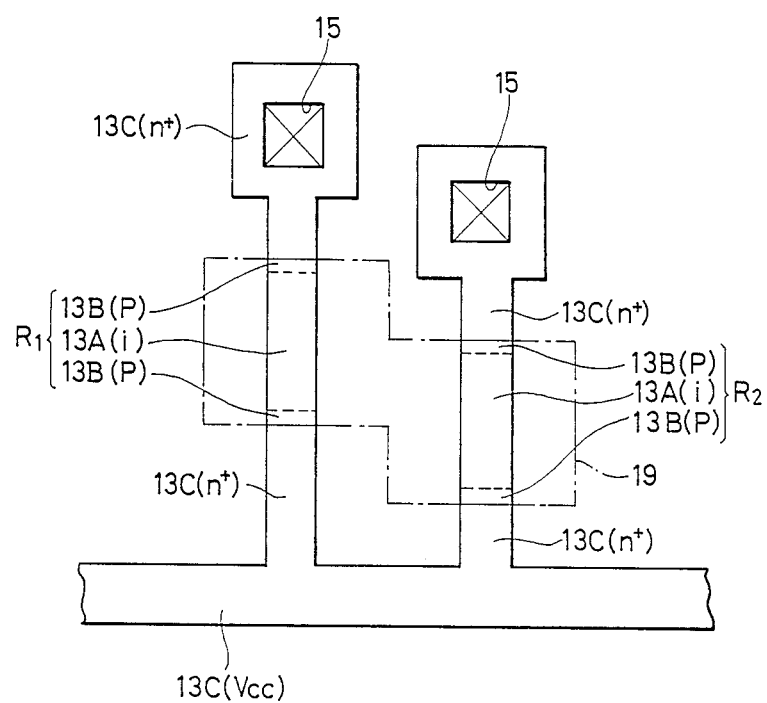
FIGS. 11 and 12 are a plan view and a sectional view, respectively, of an essential part of a memory cell, which are employed to describe a still further embodiment of the present invention.

FIGS. 9 and 10 show in combination an example in which the p-type polysilicon film 13B is formed in such a manner that it is not in contact with the $n^+$-type semiconductor region 9. More specifically, the polysilicon film 13 has a structure in which the conductivity type thereof changes from the power supply voltage wiring side in the following sequence: $n^+$-type - i-type - p-type - $n^+$-type. In consequence, the patterns of the masks 17 and 18 are changed as shown in FIG. 9. As a result, the cross-sectional configuration of the polysilicon film 13 is such as that shown in FIG. 10. More specifically, the semiconductor region 9 and the $n^+$-type polysilicon film 13C are in contact with each other. Thus, it is possible to prevent the p-type impurity in the polysilicon film 13B from being diffused into the n-type semiconductor region. In addition, since no pn junction is formed at the boundary between the polysilicon film 13 and the semiconductor substrate 1, it is possible to obtain a stable pn junction involving less leakage current.

Figure 12:
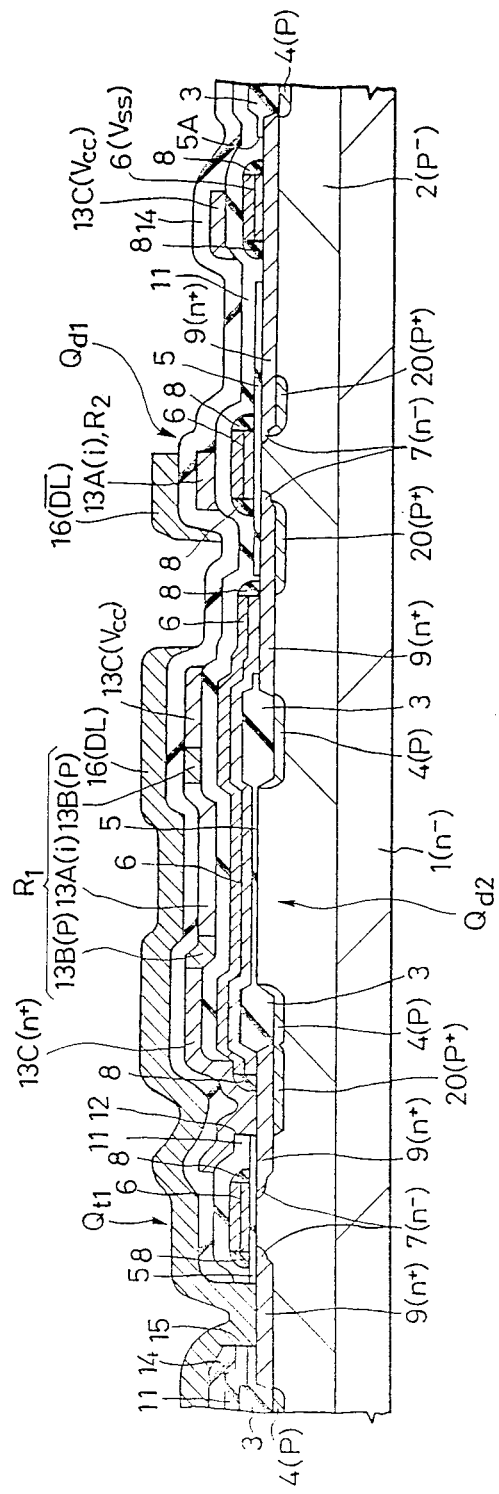

FIGS. 11 and 12 show in combination an example in which the p- and $n^+$-type polysilicon films 13B and 13C are formed using only one mask as shown in FIG. 11. As will be clear from FIG. 11, the polysilicon film 13 has a structure in which the conductivity type thereof changes from the power supply voltage wiring side in the following sequence: $n^+$-type - p-type - i-type - p-type - $n^+$-type. Since the regions 13B and 13C are formed using a single mask, the manufacturing process is changed as follows. After the patterning of the polysilicon film 13, a mask 19 made of, for example, a resist film is formed as shown in FIG. 11. In this state, boron fluoride ions and arsenic ions are implanted under the above-described conditions, respectively, and then, a heat treatment is carried out. In consequence, the boron fluoride and arsenic are horizontally diffused in the polysilicon film 13. There is a difference between the diffusion rate of boron and that of arsenic, that is, the former is larger than the latter. Therefore, the p-type region 13B is formed by making use of this fact. As a result, the cross-sectional configuration of the polysilicon film 13 is such as that shown in FIG. 12. This method enables a reduction in the number of required manufacturing steps. In addition, since it becomes unnecessary to provide the alignment margin between the masks 17 and 18, that is, since the regions 13A, 13B and 13C are self-aligned, this method is advantageous in realization of a very fine or minute device.

The p-type region 13B may be formed in the center of the i-type region 13A. More specifically, the polysilicon film 13 may have a structure in which the conductivity type thereof changes from the power supply voltage wiring side in the following sequence: $n^+$-type - i-type - p-type - i-type - $n^+$-type. Such structure can be realized by appropriately modifying the patterns of the masks 17 and 18.

The first embodiment or the above-described modifications of the first embodiment may be combined with the second embodiment. More specifically, the load elements $R_1$ and $R_2$ may be formed in the manner shown in the first embodiment or the modifications thereof using a plysilicon film which is deposited at 600° to 700° C. and with a thickness of about 1000 Å or less.

The present invention may be widely applied not only to memory IC's having memory cells each including polysilicon with a high resistance, but also to, for example, logic IC's in which the above-described memory cell is formed in a part on the same substrate.

What is claimed is:

1. A semiconductor memory device having a memory cell including a flip-flop composed of first and second inverters, the output terminals of said first and second inverters being respectively connected to the input terminals of said second and first inverters, each of said first and second inverters being constituted by a MISFET and a load element which is connected in series to said MISFET and which is formed by a polysilicon film, said polysilicon film including a first region of a first conductivity type, a second region of a second conductivity type, and a third region having no impurities of said first and second conductivity types introduced therein and defining said load element, said first region being formed on the side of said polysilicon film which is closer to the end thereof to which a power supply voltage is applied than at least said second and third regions, and said second region being formed on the side of said polysilicon film which is closer to said MISFET than at least said third region.

2. A semiconductor memory device according to claim 1, wherein said first and second conductivity types are respectively n- and p-types, the impurity concentration of said first region being made higher than that of said second region.

3. A semiconductor memory device according to claim 2, wherein said polysilicon film further includes a fourth region of the first conductivity type, said fourth region being formed on the side of said polysilicon film which is closer to said MISFET than said second region, and having the same impurity concentration as that of said first region.

4. A semiconductor memory device according to claim 3, wherein said polysilicon film further includes a fifth region of the second conductivity type, said fifth region being formed between said first and third regions and having the same impurity concentration as that of said second region.

5. A semiconductor memory device according to claim 2, wherein a data line is stacked over at least a part of said second and third regions.

6. A semiconductor memory device according to claim 5, wherein the gate electrode of said MISFET is formed below at least a part of said second and third regions.

* * * * *